United States Patent [19]
Takemura

[11] Patent Number: 6,108,525
[45] Date of Patent: Aug. 22, 2000

[54] TRANSCEIVER

[75] Inventor: Rikio Takemura, Tokyo, Japan

[73] Assignee: NEC Corporation, Tokyo, Japan

[21] Appl. No.: 09/128,645

[22] Filed: Aug. 4, 1998

[30] Foreign Application Priority Data

Aug. 6, 1997 [JP] Japan ................................. 9-211855

[51] Int. Cl.[7] .............................. H04B 17/00; H04B 1/18
[52] U.S. Cl. .................... 455/67.4; 455/126; 455/192.2; 455/257
[58] Field of Search ................................. 455/67.1, 67.4, 455/423, 76, 126, 115, 192.1, 192.2, 255–260, 265; 375/344

[56] References Cited

U.S. PATENT DOCUMENTS

| 5,115,515 | 5/1992 | Yamamoto et al. | 455/265 |
| 5,493,710 | 2/1996 | Takahara et al. | 455/67.4 |

FOREIGN PATENT DOCUMENTS

| 2-131027 | 5/1990 | Japan . |
| 2-131028 | 5/1990 | Japan . |
| 4-240923 | 8/1992 | Japan . |
| 5-7166 | 1/1993 | Japan . |

*Primary Examiner*—Nguyen Vo
*Attorney, Agent, or Firm*—Ostrolenk, Faber, Gerb & Soffen, LLP

[57] ABSTRACT

The transceiver of the present invention comprises: a modulator for modulating predetermined data to obtain a received signal at a predetermined received frequency; a local oscillator for producing a local oscillator frequency signal; a mixer for producing an intermediate frequency signal by mixing the local oscillator frequency signal and the received signal; a band pass filter for limiting a bandwidth of the immediate frequency signal; a demodulator for obtaining received data by demodulating the immediate frequency signal the bandwidth of which has been limited; a measuring device for measuring receiving sensitivity by comparing the received data with the predetermined data; and a frequency correction determinator for correcting a frequency of the local oscillator frequency signal and for setting the corrected frequency as a new frequency of the local oscillator frequency signal when a desired measuring result is obtained in the measuring device.

7 Claims, 4 Drawing Sheets

TRANSCEIVER

FIELD OF THE INVENTION

The present invention relates to a transceiver, and more particularly to transceivers which produce an immediate frequency signal by mixing a local oscillator frequency signal and a received signal, limit a bandwidth of the immediate frequency signal by a band pass filter, and obtain received data by demodulation.

This application is based on Japanese Patent Application No, Hei 9-211855, the contents of which are incorporated herein by reference.

BACKGROUND ART

A conventional transceiver is constructed as shown in FIG. 6 (for example, Japanese Patent Application, First Publication No. Hei 5-7166). FIG. 6 is a block diagram showing an example of the conventional transceiver. A received signal is inputted from an input terminal 61 to a frequency mixer 62, and is converted into an immediate frequency signal according to a signal from a local oscillator 63. The converted immediate frequency signal is inputted through a BPF (band pass filter) 64 to a demodulator 65, is demodulated, and is outputted as a demodulated signal.

Meanwhile, the temperature detector 66 for detecting an ambient temperature of the local oscillator 63 and the BPF 64 outputs a detection signal to a temperature corrector 67. The temperature corrector 67 outputs a predetermined correction control signal to a frequency controller 68 in order to correct variation of a oscillator frequency of the local oscillator 63 corresponding to variation in temperature. The frequency controller 68 controls the oscillator frequency of the local oscillator 63 according to the inputted correction control signal, thus preventing deterioration of the receiving sensitivity due to variation in temperature.

The ambient temperatures of the local oscillator and the BPF are detected and the oscillator frequency of the local oscillator, that is, the local oscillator frequency is corrected based on the detection result. However, the limitation bandwidth (frequency characteristic) of the BPF is varied due to variation of the ambient temperature, thereby causing a problem that the receiving sensitivity deteriorates. Further, because the temperature characteristic is irregular, deterioration of the receiving sensitivity cannot be prevented.

SUMMARY OF THE INVENTION

It is therefore an object of the present invention to provide a transceiver which can prevent deterioration of a receiving sensitivity due to variation in temperature.

In order to accomplish the above object, a transceiver of the present invention comprises: a means for modulating predetermined data to obtain a received signal at a predetermined received frequency; a local oscillator for producing a local oscillator frequency signal; a means for producing an intermediate frequency signal by mixing the local oscillator frequency signal and the received signal; a band pass filter for limiting a bandwidth of the immediate frequency signal; a means for obtaining received data by demodulating the immediate frequency signal the bandwidth of which has been limited; a measuring device for measuring receiving sensitivity by comparing the received data with the predetermined data; and a frequency correction determinator for correcting a frequency of the local oscillator frequency signal and for setting the corrected frequency as a new frequency of the local oscillator frequency signal when a desired measuring result is obtained in the measuring device.

The measuring device compares the received data with the predetermined data on a bit basis and outputs a bit error generation rate as the measuring result.

The frequency of the local oscillator frequency signal is corrected, the receiving sensitivity, for example, a bit error generation rate, is measured by comparing the received data with the predetermined data, and a corrected frequency is selected as a new frequency of the local oscillator frequency signal when a desired measuring result is obtained.

In another aspect of the present invention, the frequency correction determinator varies the frequency of the local oscillator frequency signal by a first correction step size, and sets the corrected frequency as a new frequency of the local oscillator frequency signal when the best measuring result is obtained.

In another aspect of the present invention, the frequency correction determinator increases and decreases the frequency of the local oscillator frequency signal by a second correction step size, compares a present measuring results with the previous measuring result, increases the frequency of the local oscillator frequency signal by a first correction step size and selects the corrected frequency as a new frequency of the local oscillator frequency signal when a better determination result is obtained at the frequency increased by a second correction step size, and decreases the frequency of the local oscillator frequency signal by a first correction step size and selects the corrected frequency as a new frequency of the local oscillator frequency signal when a better determination result is obtained at the frequency decreased by the second correction step size.

In another aspect of the present invention, the frequency correction determinator varies the frequency of the local oscillator frequency signal by a first correction step size, sets the corrected frequency as a new frequency of the local oscillator frequency signal when a better measuring result is obtained, and repeats the correction of the frequency of the local oscillator until a desired measuring result is obtained.

In another aspect of the present invention, the frequency correction determinator compares a measuring result at a frequency of the local oscillator frequency signal with a predetermined threshold, corrects the frequency of the local oscillator frequency signal when the measuring result is less than the threshold, and sets the corrected frequency as a new frequency of the local oscillator frequency signal when a desired measuring result is obtained in the measuring device.

In another aspect of the present invention, the measuring device measures receiving sensitivity by comparing the received data with transmitting data transmitted to another device. The transmitting data are modulated at the received frequency to produce the received signal, the received data being obtained from the received signal.

According to the present invention, because a self-diagnosis function of receiving sensitivity is provided and a local oscillator frequency is corrected according to variation in temperature of a BPF (band pass filter) based on the self-diagnosis result, the gap between the intermediate frequency signal the frequency is converted by a frequency mixer and the bandwidth of the BPF can be corrected. Accordingly, even when the temperature characteristic of the BPF is irregular, deterioration of the receiving sensitivity caused by the variation in bandwidth of the BPF due to temperature can be prevented.

DETAILED DESCRIPTION OF THE PREFERRED EMBODIMENTS

The best mode of the transceiver, according to an embodiment of the present invention, will be explained with reference to Figures.

Figure 1:
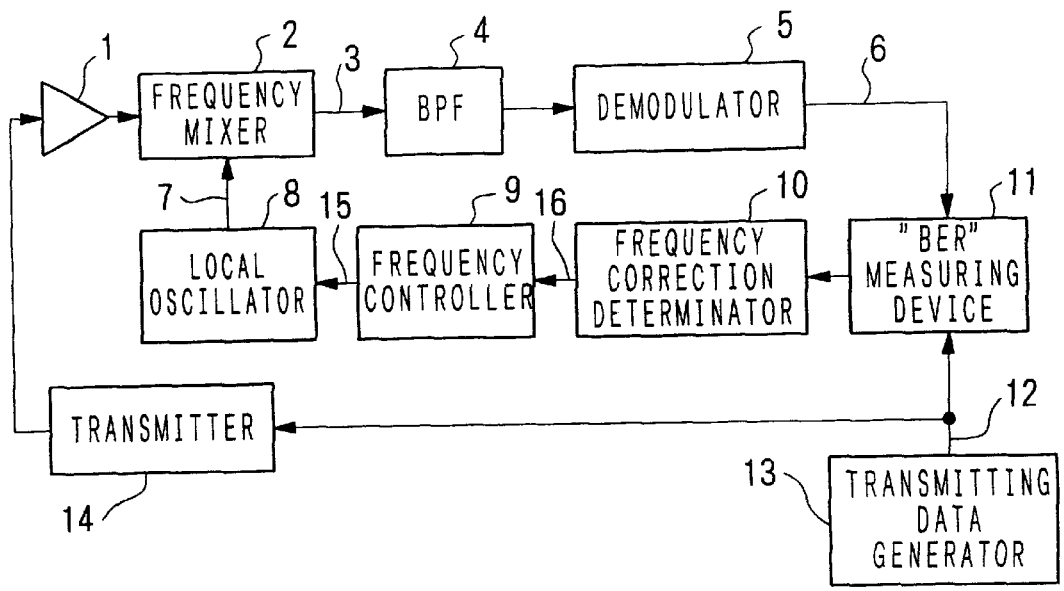
FIG. 1 is a block diagram showing a transceiver of an embodiment of the present invention.

FIG. 1 is a block diagram showing an embodiment of the transceiver according to the present invention. A transmitting data generator 13 generates transmitting data 12 to be sent to another device, and provides the data 12 to a transmitter 14. The transmitter 14 modulates the transmitting data 12 at a predetermined received frequency, and outputs the data to a receiving amplifier 1. The receiving amplifier 1 amplifies the output from the transmitter 14 and outputs it to a frequency mixer 2.

The frequency mixer 2 receives the output from the receiving amplifier 1 and an output from a local oscillator 8, that is, a local oscillator frequency signal, and performs frequency conversion to obtain an intermediate frequency signal 3. The BPF (band pass filter) 4 limits a bandwidth of the inputted intermediate frequency signal 3. A demodulator 5 demodulates the output from the BPF 4 to obtain received data 6, and outputs the data 6 to a bit error measuring device (hereinafter referred to as a BER measuring device) 11.

The BER measuring device 11 compares the received data 6 outputted from the demodulator 5 with the transmitting data 12 outputted from the transmitting data generator 13 on a bit basis, determines a bit error generation rate (hereinafter referred to as a BER value), and outputs a measuring result to a frequency correction determinator 10. The frequency correction determinator 10 outputs a frequency correction signal 16 to a frequency controller 9 according to the BER measuring result.

The frequency controller 9 inputs a frequency setting signal 15 to the local oscillator 8 according to the frequency correction signal 16. The local oscillator 8 outputs a local oscillator frequency signal 7 having a frequency in accordance with the frequency setting signal 15. Thus, the frequency mixer 2 obtains the intermediate frequency signal 3 having a frequency in accordance with the local oscillator frequency signal 7.

An operation of the present invention will be explained with reference to FIG. 1. The transmitting data generator 13 generates the transmitting data 12 and provides them to the transmitter 14 and the BER measuring device 11. The transmitter 14 modulates the transmitting data 12 and outputs a transmitting signal.

Although the transmitting signal is usually transmitted to another device, the transmitting signal may be transmitted in a frequency correction test of a local oscillator frequency. In a TDD-type transceiver, the frequency correction test of the local oscillator frequency may be done by performing a receiving operation at the time of normal transmission because it is unnecessary to perform the receiving operation synchronously with transmission timings.

The receiving amplifier 1 amplifies the output from the transmitter 14 and outputs it to the frequency mixer 2, which receives the output from the receiving amplifier 1 and the output from the local oscillator 8 and performs the frequency conversion to produce the intermediate frequency signal 3 having a frequency which corresponds to a difference between the two signals.

The BPF 4 receives the intermediate frequency signal 3, limits the bandwidth thereof, and outputs it. Preferably, a center frequency of the bandwidth limitation by the BPF 4 corresponds to a center frequency of the intermediate frequency signal 3, so that the best receiving sensitivity characteristic can be obtained. The demodulator 5 receives the output from the BPF 4, performs demodulation, produces the received data 6, and outputs the data 6 to the BER determinator 11.

The BER determinator 11 receives the received data 6 and the transmitting data 12, determines the BER value by comparing them on a bit basis, and outputs a determination result to the frequency correction determinator 10. The frequency correction determinator 10 determines whether the frequency correction is necessary, according to the determination result. When it is determined that the BER value is more than a predetermined threshold, the frequency correction signal 16 is outputted to the frequency controller 9.

The frequency controller 9 outputs the frequency setting signal 15 to the local oscillator 8 according to the frequency correction signal 16. The local oscillator 8 corrects the frequency of the local oscillator frequency signal 7 according to the frequency setting signal 15. The received signal is converted into the intermediate frequency signal 3 according to the local oscillator frequency signal 7 and is outputted from the demodulator 5, and the BER value is determined by the BER determinator 11.

The frequency correction determinator 10 compares a present BER value with the previously determined BER value to determine whether the BER value has been improved, and again produces the frequency correction signal 16 so as to settle the BER value to the best point. This operation is repeated so that the frequency of the immediate frequency signal. 3 is adjusted to the center frequency of the BPF 4, and this enhances the receiving sensitivity of the transceiver to the best condition.

A first embodiment will be further explained with reference to FIGS. 2 and 3, where the transceiver shown in FIG. 1 is a TDMA-TDD-type transceiver of which transmitting and receiving frequencies are set within the same frequency band.

Figure 3:
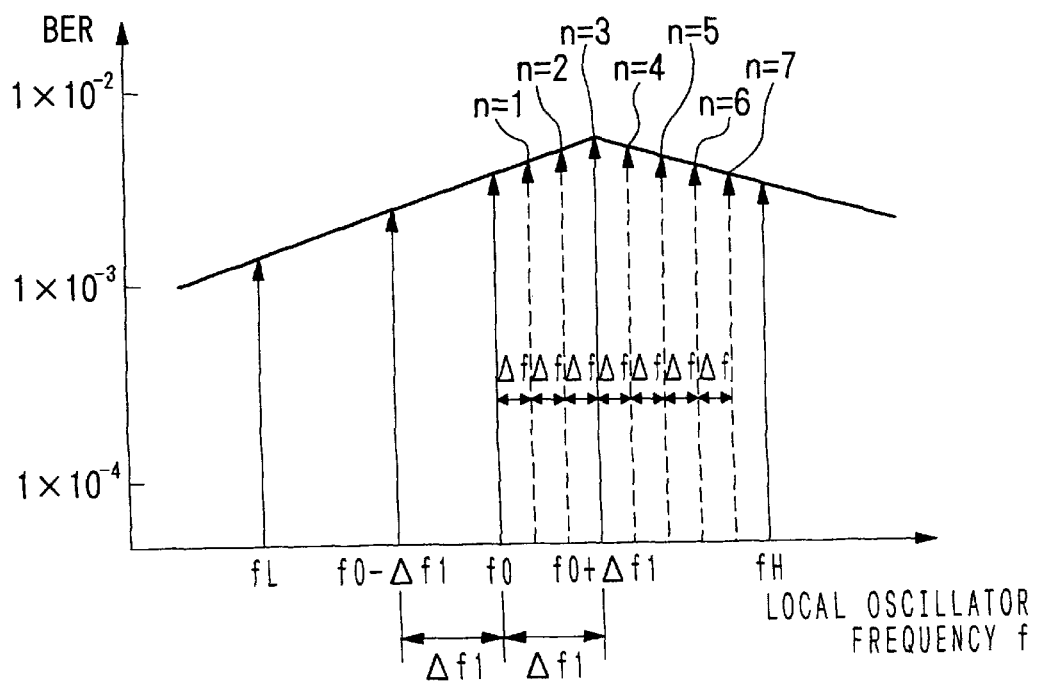
FIG. 3 is a diagram explaining the relationship between a local oscillator frequency and a BER value (bit error generation rate) in the first embodiment of the present invention.
Figure 2:
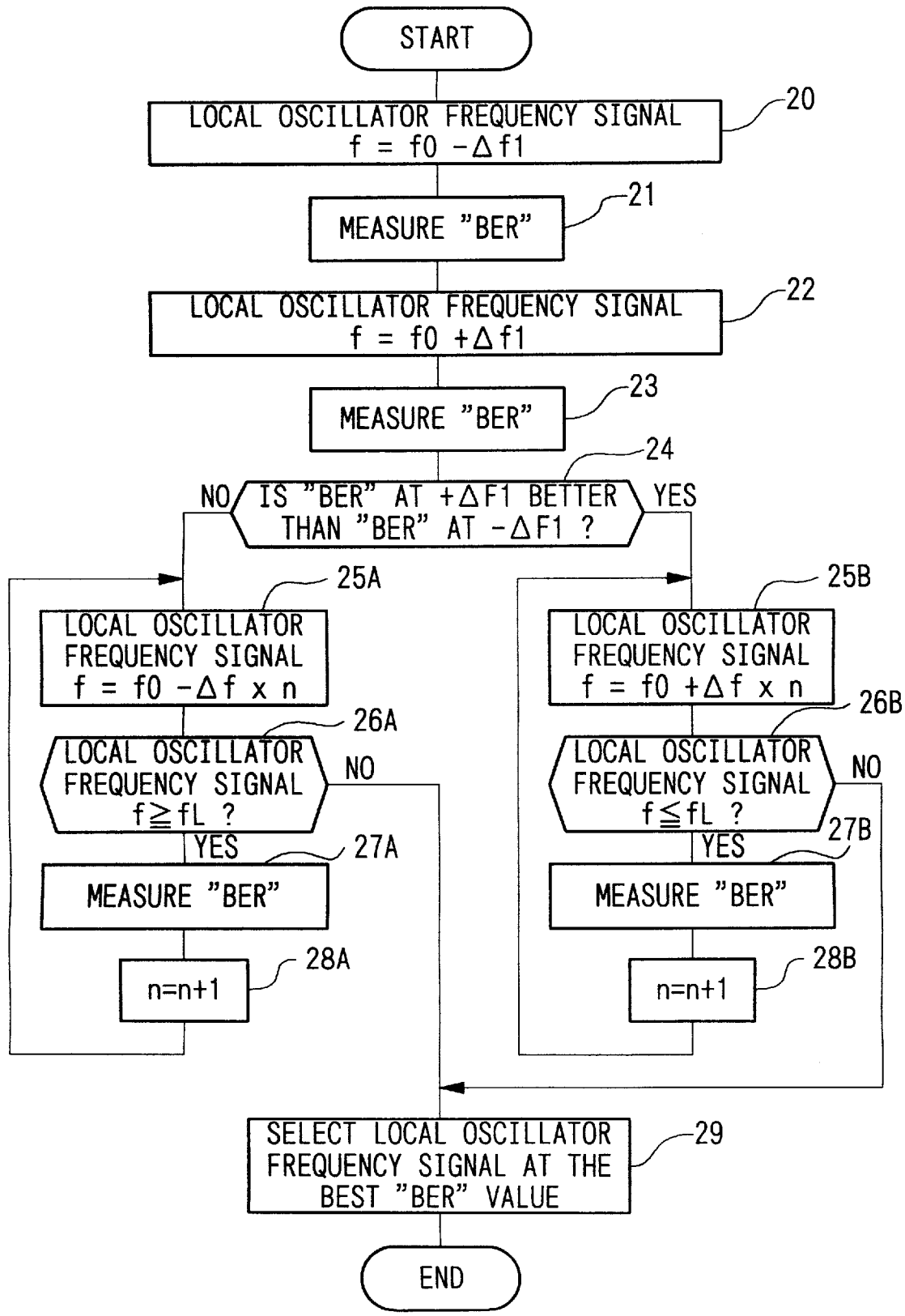
FIG. 2 is a flow chart showing frequency correction in a first embodiment of the present invention.

FIG. 2 is a flow chart showing a frequency correction by the first embodiment, and FIG. 3 is a diagram explaining the relationship between the local oscillator frequency and the BER value in the first embodiment.

The transmitting data generator 13 generates the transmitting data 12 and provides them to the transmitter 14 and to the BER measuring device 11. The transmitting data 12 are modulated by the transmitter 4, are amplified by the receiving amplifier 1, and are inputted to the frequency mixer 2. The frequency mixer 2 receives the output from the receiving amplifier 1 and the output from the local oscillator 8, and converts them into the immediate frequency signal 3.

The immediate frequency signal 3 is inputted to the BPF 4, is limited in bandwidth, is demodulated by the demodulator 5, and is outputted as the received data 6. The BER measuring device 11 compares the received data 6 with the transmitting data 12 to measure the BER value. The frequency correction determinator 10 compares the BER measuring result with a predetermined threshold, and determines whether the frequency correction of the local oscillator frequency is necessary.

When the BER measuring result is less than the predetermined threshold, it is determined that the frequency correction is necessary, the frequency correction signal 16 is outputted, and the frequency correction in FIG. 2 commences.

The frequency controller 9 outputs the frequency setting signal 15 to the local oscillator 8 in order to correct a present frequency f0 of the local oscillator frequency signal 7 to a frequency f0−Δf1 which is less than the frequency f0.

The frequency f0 is an initial value (present value) of the frequency of the local oscillator frequency signal 7, and Δf1 corresponds to a predetermined frequency step size. The local oscillator 8 includes a voltage control oscillator of which oscillator frequency can be controlled by an external means, and is constructed of a phase lock loop (PLL) circuit for controlling a oscillator frequency signal from the local oscillator 8. The output from the local oscillator 8, that is, the local oscillator frequency signal 7 is corrected according to the inputted frequency setting signal 15 (at step 20).

Accordingly, the frequency mixer 2 converts the output from the receiving amplifier 1 into the immediate frequency signal 3 according to the corrected local oscillator frequency signal 7. The immediate frequency signal 3 is limited in bandwidth by the BPF 4, is demodulated by the demodulator 5, and is outputted as the received data 6. The BER measuring device 11 measures the BER value from the received data 6 and the transmitting data 12 (at step 21).

The frequency controller 9 outputs the frequency setting signal 15 to the local oscillator 8 to correct the local oscillator frequency signal 7 to a frequency f0+Δf1 which is greater than the current frequency f0. The local oscillator frequency signal 7 from the local oscillator 8 is corrected according to the inputted frequency setting signal 15 (at step 22), and the BER value is measured when the corrected local oscillator frequency signal is used (in step 23).

Thus, the frequency of the local oscillator frequency signal 7 is positively or negatively corrected by Δf1 and the BER value is measured, so that the BER value in the frequency correction shows a tendency to be improved. The frequency correction determinator 10 determines which BER value of the local oscillator frequency signals f=f0+Δf1 or f=f0−Δf1 of the BER value measuring results is better (at step 24).

If the BER measuring result is better when the frequency of the local oscillator frequency signal 7 is positively corrected ("yes" at step 24), the frequency controller 9 increases the frequency f of the local oscillator frequency signal by the minimum frequency step size Δf in the frequency correction to a test frequency f=f0+Δf×1 (n=1) (at step 25B). Next, it is determined whether the test frequency f is less than a maximum frequency fH of a frequency correction range (at step 26B).

When the test frequency f is less than the correction maximum frequency fH ("yes" at step 26B), the frequency setting signal 15 corresponding to the frequency f is outputted. In response to this, the local oscillator 8 outputs the local oscillator frequency signal 7 having the test frequency f, and the BER value is measured by the BER measuring device 11 in a manner similar to that described above (at step 27B).

Thus, the frequency f of the local oscillator frequency signal 7 is tentatively varied from f0 to the correction maximum frequency fH by Δf, and the BER values are measured at respective frequencies f (at steps 25B to 28B). For example, as shown in FIG. 3, the BER values are measured at the respective frequencies f from f=f0+Δf (n=1) to f=f0+7Δf (n=7), and the frequency f at the best BER value, that is, f=f0+3Δf (n=3) is selected as a new frequency f0 of the local oscillator frequency signal 7 (at step 29).

If a better BER measuring result is obtained when the local oscillator frequency signal 7 is negatively corrected ("no" at step 24), the frequency f of the local oscillator frequency signal 7 is tentatively varied from f0 to a correction minimum frequency fL by Δf, the BER values are measured at the respective frequencies f (at steps 25A to 28A), and the frequency f at the best BER value is selected as a new frequency f0 of the local oscillator frequency signal 7 (at step 29).

By performing the above frequency correction, the frequency of the local oscillator frequency signal 7 is appropriately controlled and selected so as to set the immediate frequency signal 3 to the center frequency of the BPF 4, thereby preventing deterioration of the receiving sensitivity, even when the bandwidth of the BPF 4 is varied because of the ambient temperature or when the receiving sensitivity deteriorates.

Next, a second embodiment of the present invention will be explained with reference to FIGS. 4 and 5, where the transceiver shown in FIG. 1 is a TDMA-TDD-type transceiver of which transmitting and receiving frequencies are set within the same frequency band.

Figure 4:
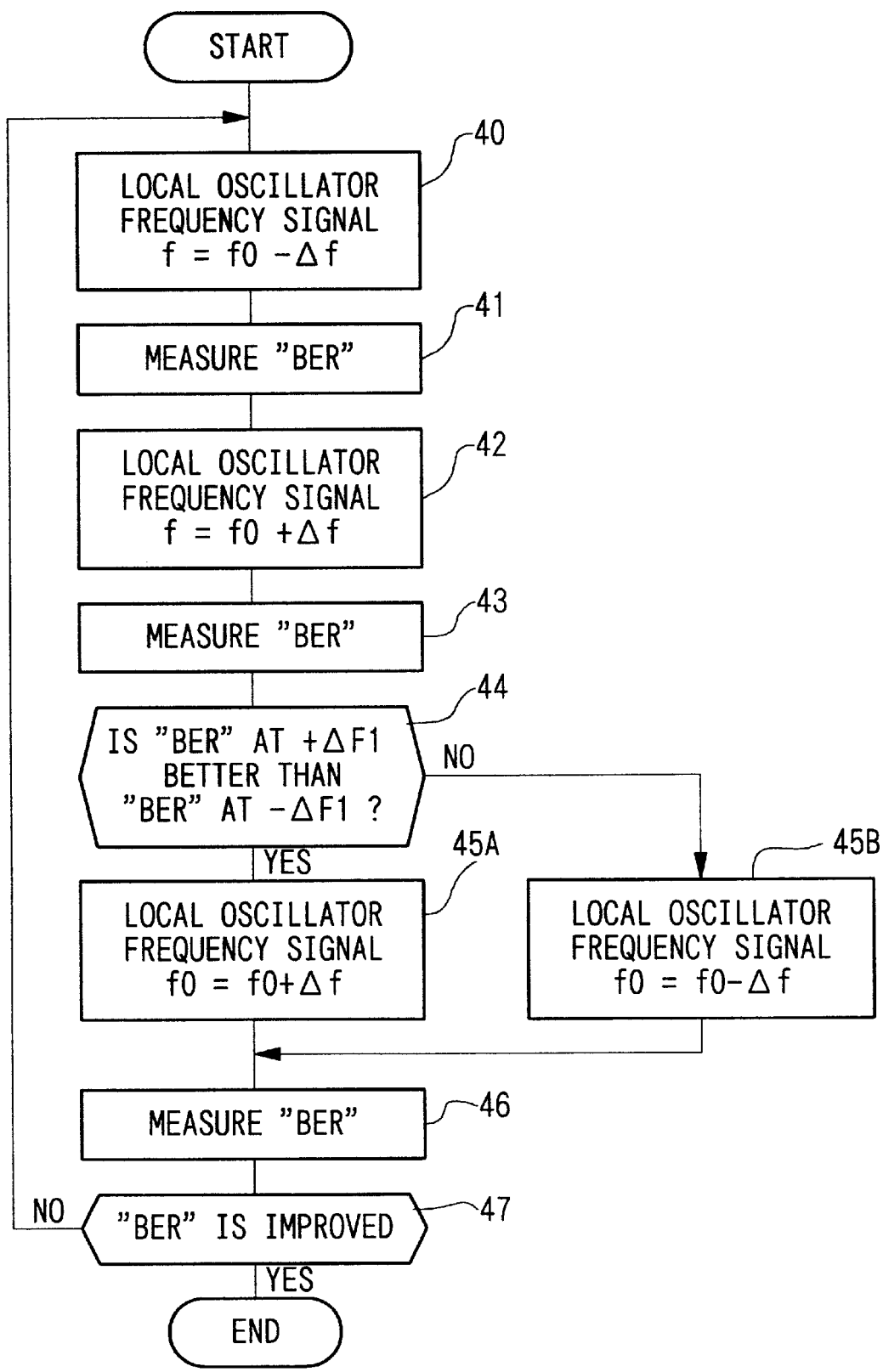
FIG. 4 is a flow chart showing frequency correction in a second embodiment of the present invention.
Figure 5:
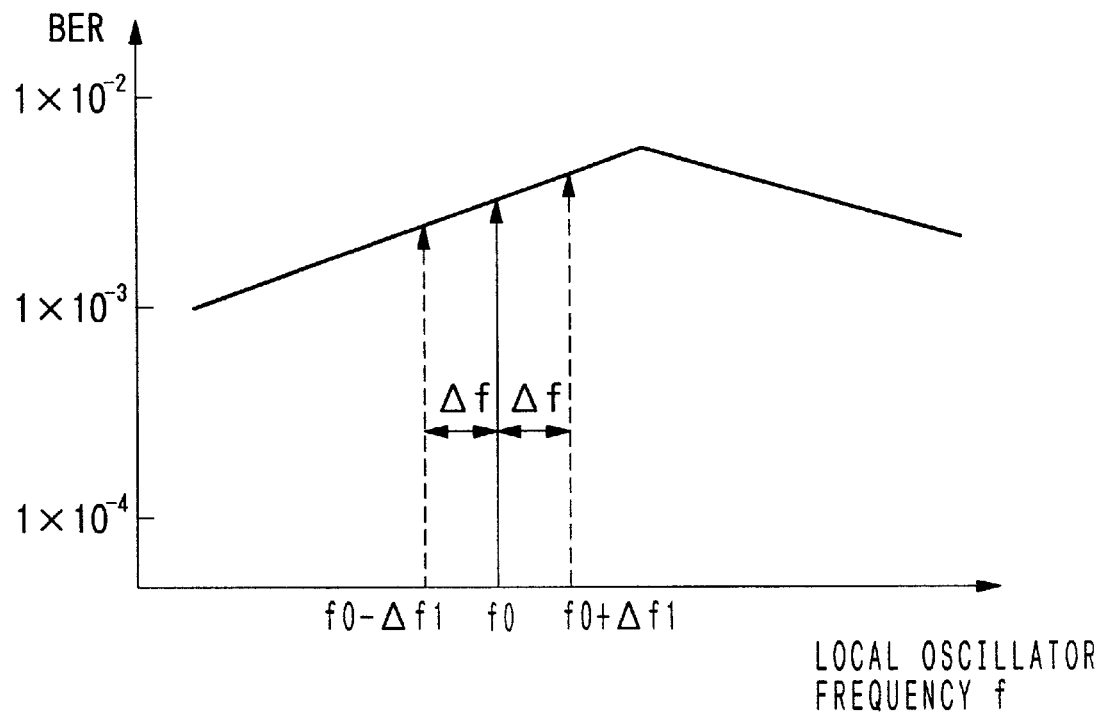
FIG. 5 is a diagram explaining the relationship between a local oscillator frequency and a BER value in the second embodiment of the present invention.
Figure 6:
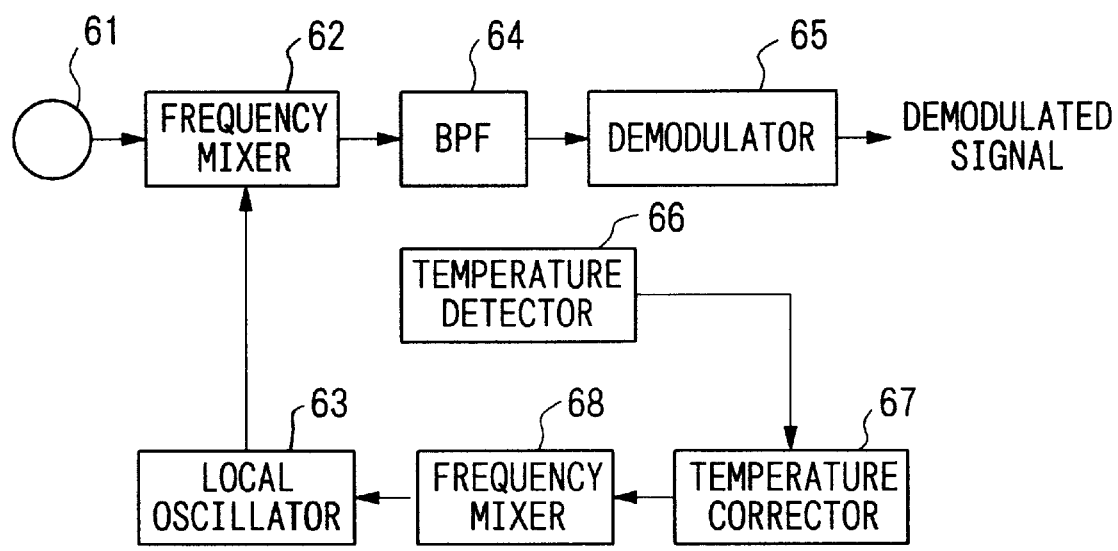
FIG. 6 is a block diagram showing a construction of a conventional transceiver.

FIG. 4 is a flow chart showing frequency correction of the second embodiment, and FIG. 5 is a diagram explaining the relationship between the local-oscillator frequency and the BER value in the second embodiment.

The frequency correction determinator 10 compares the BER measuring result from the BER measuring device 11 using the current local oscillator frequency signal 7, with a predetermined threshold, and determines whether frequency correction for the local oscillator frequency is necessary. When the BER measuring result is less than the predetermined threshold, it is determined that the frequency correction is necessary, the frequency correction signal 16 is outputted, and the frequency correction shown in FIG. 4 is started.

The frequency controller 9 outputs the frequency setting signal 15 to the local oscillator 8 in order to correct a present frequency f0 of the local oscillator frequency signal 7 to a frequency f0−Δf1 which is less than the present frequency f0 (at step 40). The frequency f0 is an initial value (present value) of the frequency of the local oscillator frequency signal 7, and Δf1 is a predetermined frequency step size.

In response to the frequency setting signal 15, the PLL circuit in the local oscillator 8 corrects the frequency of the local oscillator frequency signal 7 to f=f0−Δf, and the BER value is measured by the BER measuring device 11 (at step 41). The frequency controller 9 outputs the frequency setting signal 15 to correct the local oscillator frequency signal to f0−Δf (at step 42), and the BER value is measured by the measuring device 11 when the frequency is f=f0+Δf (at step 43).

That is, the frequency of the local oscillator frequency signal 7 is positively or negatively corrected by Δf, and the respective BER values are measured. The frequency correction determinator 10 determines which BER value at the frequencies f=f0+Δf or f=f0−Δf is better (at step 44).

When the BER value at f=f0+Δf is better ("yes" at step 44), and f0=f0+Δf is selected as a new frequency of the local oscillator frequency signal 7 (at step 45B). Meanwhile, when the BER value at f=f0−Δf is better ("no" at step 44), f0=f0−Δf is selected as a new frequency of the local oscillator frequency signal 7 (at step 45B).

That is, one of the frequencies increased and decreased from f0 by Δf corresponding to the better BER value is selected as a new frequency of the local oscillator frequency signal 7, and the BER value is again measured by the BER measuring device 11 (at step 46).

The frequency correction determinator 10 compares the BER value with the predetermined threshold (at step 47), and when the BER value is less than the predetermined threshold ("no" at step 47), the process returns to step 40, in which a new frequency of the local oscillator frequency signal 7 is selected. When the BER is greater than the predetermined threshold ("yes" at step 47), it is determined that the desired sensitivity is obtained, and the process is terminated.

In the above description, the TDMA-TDD-type transceiver of which transmitting and receiving frequencies are set within the same frequency band is explained as an example, and the frequency correction determinator 10 always determines whether the frequency correction is necessary, when transmitting the transmitting data to another device. For this reason, satisfactory sensitivity is always selected against an ambient temperature, and deterioration of the receiving sensitivity is prevented. Further, it is possible to confirm normality of the modulation in the transmitter and of the demodulation in the receiver.

Depending on the situation, the frequency correction does not need to be automatically performed, and may be performed in response to external instructions or operations. When the transmitting and receiving frequencies are not set within the same frequency bandwidth, the same effect as described is obtained by providing a modulator instead of the transmitter 14, and the modulator modulates the transmitting data 12 using the received frequency and outputs the modulated signal to the receiving amplifier 1.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A transceiver comprising:
 a means for modulating predetermined data to obtain a received signal at a predetermined received frequency;
 a local oscillator for producing a local oscillator frequency signal;
 a means for producing an intermediate frequency signals by mixing said local oscillator frequency signal and said received signal;
 a band pass filter for limiting a bandwidth of said immediate frequency signal;
 a means for obtaining received data by demodulating said immediate frequency the bandwidth of which has been limited;
 a measuring device for measuring receiving sensitivity by comparing said received data with said predetermined data; and
 a frequency correction determinator for correcting a frequency of said local oscillator frequency signal and for setting said corrected frequency as a new frequency of said local oscillator frequency signal when a desired measuring result is obtained in said measuring device.

2. A transceiver according to claim 1, wherein said measuring device compares said received data with said predetermined data on a bit basis and outputs a bit error generation rate as said measuring result.

3. A transceiver according to claim 1, wherein said frequency correction determinator varies said frequency of said local oscillator frequency signal by a first correction step size, and sets said corrected frequency as a new frequency of said local oscillator frequency signal when the best measuring result is obtained.

4. A transceiver according to claim 3, wherein said frequency correction determinator increases and decreases said frequency of said local oscillator frequency signal by a second correction step size,
 compares a present measuring results with the previous measuring result,
 increases said frequency of said local oscillator frequency signal by a first correction step size and selects said corrected frequency as a new frequency of said local oscillator frequency signal when a better determination result is obtained at said frequency increased by a second correction step size, and
 decreases said frequency of said local oscillator frequency signal by a first correction step size and selects said corrected frequency as a new frequency of said local oscillator frequency signal when a better determination result is obtained at said frequency decreased by a second correction step size.

5. A transceiver according to claim 1, wherein said frequency correction determinator varies said frequency of said local oscillator frequency signal by a first correction step size, sets said corrected frequency as a new frequency of said local oscillator frequency signal when a better measuring result is obtained, and repeats the correction of said frequency of said local oscillator until a desired measuring result is obtained.

6. A transceiver according to claim 1, wherein said frequency correction determinator compares a measuring result at a frequency of said local oscillator frequency signal with a predetermined threshold, corrects said frequency of said local oscillator frequency signal when said measuring result is less than said threshold, and sets said corrected frequency as a new frequency of said local oscillator frequency signal when a desired measuring result is obtained in said measuring device.

7. A transceiver according to claim 1, wherein said measuring device measures receiving sensitivity by comparing said received data with transmitting data transmitted to another device, said transmitting data being modulated at said received frequency to produce said received signal, said received data being obtained from said received signal.

* * * * *